(12) United States Patent
Park et al.

(10) Patent No.: US 7,732,296 B2
(45) Date of Patent: Jun. 8, 2010

(54) METHOD OF FABRICATING METAL-INSULATOR-METAL CAPACITOR AND METAL-INSULATOR-METAL CAPACITOR MANUFACTURED BY THE METHOD

(75) Inventors: Jung-min Park, Jeollanam-do (KR); Seok-jun Won, Seoul (KR); Min-woo Song, Seongnam-si (KR); Yong-kuk Jeong, Seoul (KR); Dae-jin Kwon, Suwon-si (KR); Weon-hong Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 569 days.

(21) Appl. No.: 11/339,151

(22) Filed: Jan. 25, 2006

(65) Prior Publication Data
US 2006/0163640 A1   Jul. 27, 2006

(30) Foreign Application Priority Data
Jan. 25, 2005   (KR) .................... 10-2005-0006779

(51) Int. Cl.
*H01L 21/20* (2006.01)
(52) U.S. Cl. .................. 438/393; 438/238; 438/239; 438/250; 438/361; 257/310; 257/E21.008; 257/E21.019; 257/E21.011
(58) Field of Classification Search .......... 438/387, 438/238–240, 243, 244, 250, 253, 381, 386, 438/393, 396, 422, 624, 637, 638, 128; 257/532, 257/295, 296, 300–302, 306, 640, 528, 632, 257/E21.008, E21.019, E21.011, 310
See application file for complete search history.

(56) References Cited
U.S. PATENT DOCUMENTS
6,251,740 B1 * 6/2001 Johnson et al. ............. 438/381
(Continued)

FOREIGN PATENT DOCUMENTS
KR   10-2002-0045891   6/2002

(Continued)

OTHER PUBLICATIONS

Chung et al., "Flowable oxide CVD Process for Shallow Trench Isolation in Silicon Semiconductor", Mar. 2004, Journal of Semiconductor Technology and Science, vol. 40 No. 1, pp. 45-51.*

*Primary Examiner*—Alexander G Ghyka
*Assistant Examiner*—Leonard Chang
(74) *Attorney, Agent, or Firm*—Mills & Onello, LLp

(57) ABSTRACT

In a method of fabricating a metal-insulator-metal (MIM) capacitor and a metal-insulator-metal (MIM) capacitor fabricated according to the method, the method comprises: forming an insulating-layer pattern on a semiconductor substrate, the insulating-layer pattern having a plurality of openings that respectively define areas where capacitor cells are to be formed; forming a lower electrode conductive layer on the insulating-layer pattern and on the semiconductor substrate; forming a first sacrificial layer that fills the openings on the lower electrode conductive layer; forming a second sacrificial layer on of the first sacrificial layer; planarizing the second sacrificial layer; exposing an upper surface of the lower electrode conductive layer; removing the exposed lower electrode conductive layer to form a plurality of lower electrodes that are separated from each other, each corresponding to a capacitor cell; and forming dielectric layers and upper electrodes, that are separated from each other, each corresponding to a capacitor cell, on each of the lower electrodes to provide a plurality of MIM capacitor cells constituting one capacitor to which the same electric signal is applied.

19 Claims, 5 Drawing Sheets

U.S. PATENT DOCUMENTS 6,350,694 B1 * 2/2002 Chang et al. ............... 438/692

FOREIGN PATENT DOCUMENTS

| KR | 10-2003-0050694 | 6/2003 |
| KR | 10-2003-0057640 | 7/2003 |

* cited by examiner

METHOD OF FABRICATING METAL-INSULATOR-METAL CAPACITOR AND METAL-INSULATOR-METAL CAPACITOR MANUFACTURED BY THE METHOD

This application claims priority from Korean Patent Application No. 10-2005-0006779 filed on Jan. 25, 2005, in the Korean Intellectual Property Office, the disclosure of which is incorporated herein by reference in its entirety.

BACKGROUND OF THE INVENTION

1. Field of the Invention

The present invention relates to a method of fabricating a metal-insulator-metal (MIM) capacitor and an MIM capacitor fabricated by the method, and more particularly, to a method of fabricating a concave-shaped MIM capacitor and an MIM capacitor fabricated by the method.

2. Description of the Related Art

Various kinds of capacitors such as metal-oxide-semiconductor (MOS) capacitors, PN junction capacitors, polysilicon-insulator-polysilicon (PIP) capacitors, and metal-insulator-metal (MIM) capacitors are used in semiconductor devices. In particular, since a metal is used as an upper electrode and/or a lower electrode of the MIM capacitor instead of a monocrystalline silicon layer or a polycrystalline silicon layer, the MIM capacitor offers reduced electrode resistance.

Accordingly, the MIM capacitor is mainly used in integrated circuits that operate at high-speed. Further, since the capacitance of the MIM capacitor is largely unaffected by variations in voltage and temperature, the MIM capacitor can be used in analog integrated circuits.

As the chip size of a semiconductor device continues to be reduced, it is difficult to obtain the required capacitance for operability of the semiconductor device. To increase the capacitance, several approaches, such as using a dielectric layer material with a high dielectric constant, reducing the thickness of the dielectric layer, and increasing the effective area of the lower electrode, have been employed. In particular, various methods have been developed in order to increase the effective area of the lower electrode. In the various approaches, the lower electrode has been formed in a cylindrical shape, a concave shape, a stacked shape, and so forth. Alternatively, a hemispherical grain (HSG) can be grown on the lower electrode to increase the effective area.

A conventional method of fabricating a concave-shaped MIM capacitor is described below. First, a lower electrode conductive layer is formed on an insulating-layer pattern formed on a semiconductor substrate and having a plurality of openings. Thereafter, a filling material for filling the openings, for example, a photoresist layer or Flowable OXide (FOX) layer, is coated on an upper part of the lower electrode conductive layer and a plurality of lower electrodes (cells) that are separated from each other are then formed through a chemical mechanical polishing (CMP) process or an etch-back process. Here, the lower electrode is referred to as a lower electrode of a plurality of unit capacitors (hereinafter, referred to as an MIM capacitor cell) constituting a single MIM capacitor.

In particular, the predetermined filling material must have an excellent gap filling characteristic to fully fill the openings on the lower electrode conductive layer. Further, the filling material must be hard enough to resist the laterally directed force applied during the CMP process. When the filling material is removed, the filling material must have such an etch selectivity that the lower electrodes are not removed. However, when the plurality of lower electrodes separated from each other are formed in the conventional MIM capacitor, the height of the lower electrode located in the center of the capacitor can be lower than the height of the lower electrode located at the edge of the capacitor. Accordingly, uniformity in the capacitance between the MIM capacitor cells can deteriorate.

SUMMARY OF THE INVENTION

The present invention provides a method of fabricating a MIM capacitor such that the capacitances of neighboring MIM capacitor cells are substantially uniform.

The present invention also provides an MIM capacitor manufactured by the above method.

In one aspect, the present invention is directed to a method of fabricating a metal-insulator-metal (MIM) capacitor, comprising: forming an insulating-layer pattern on a semiconductor substrate, the insulating-layer pattern having a plurality of openings that respectively define areas where capacitor cells are to be formed; forming a lower electrode conductive layer on the insulating-layer pattern and on the semiconductor substrate; forming a first sacrificial layer that fills the openings on the lower electrode conductive layer; forming a second sacrificial layer on the first sacrificial layer; planarizing the second sacrificial layer; exposing an upper surface of the lower electrode conductive layer; removing the exposed lower electrode conductive layer to form a plurality of lower electrodes that are separated from each other, each corresponding to a capacitor cell; and forming dielectric layers and upper electrodes, that are separated from each other, each corresponding to a capacitor cell, on each of the lower electrodes to provide a plurality of MIM capacitor cells constituting a single capacitor to which the same electrical signal is applied.

In one embodiment, the first sacrificial layer is formed of a material having a better gap-filling characteristic than the second sacrificial layer.

In another embodiment, the second sacrificial layer is formed using a chemical vapor deposition (CVD) method.

In another embodiment, the second sacrificial layer is formed of one of a Plasma Enhanced-Tetra Ethyl Ortho Silicate (PE-TEOS) single layer, a Plasma Enhanced OXide (PEOX) single layer, a BoroPhosphoSilicate Glass (BPSG) single layer, High Density Plasma (HDP) oxide, an Undoped Silicate Glass (USG) single layer, and a stacked layer thereof.

In another embodiment, the first sacrificial layer is formed of one of a Flowable OXide (FOX) single layer, Tonen SilaZene (TOSZ) single layer, USG single layer, BoroSilicate Glass (BSG), Phosphor Silicate Glass (PSG), BPSG, and a stacked layer thereof.

In another embodiment, the second sacrificial layer is formed to a thickness of 6,000-10,000 Å.

In another embodiment, the first sacrificial layer is formed to a thickness of 2,000-5,000 Å.

In another embodiment, planarizing the second sacrificial layer is performed so that a thickness of the second sacrificial layer in a peripheral area of the areas where the MIM capacitor cells are to be formed is in the range of 1,000-2,000 Å.

In another embodiment, exposing the upper surface of the lower electrode conductive layer is performed through an etch-back process.

In another embodiment, the etch selectivity of the second sacrificial layer to the first sacrificial layer is controlled to be 1.2:1 through 1.5:1 in the etch-back process.

In another embodiment, exposing the upper surface of the lower electrode conductive layer is performed so that a surface of the first sacrificial layer remaining within the openings is substantially level with a surface of the insulating-layer pattern or is recessed in the insulating-layer pattern to a certain depth.

In another embodiment, a deviation of the height of the first sacrificial layer that fills each of the openings in a resultant structure obtained by exposing the upper surface of the lower electrode conductive layer is about 300 Å.

In another embodiment, the openings are arranged at a regular pitch.

In another embodiment, the insulating-layer pattern is an interwiring insulating-layer pattern.

In another embodiment, the method further comprises forming a first upper interconnect on the insulating-layer pattern to apply the same electric signal to the upper electrodes which are separated from each other according to the MIM capacitor cells.

In another embodiment, the method further comprises, before forming the insulating-layer pattern, forming a lower interconnect on the semiconductor substrate to apply the same electric signal to the lower electrodes which are separated from each other according to the MIM capacitor cells.

In another embodiment, the method further comprises forming a second upper interconnect around the areas where the capacitor cells are formed, wherein the second upper interconnect is electrically connected to the lower interconnect.

In another embodiment, the method further comprises, before forming the second upper interconnect, forming a via within the insulating-layer pattern, the via electrically connecting the lower interconnect to the second upper interconnect.

In another aspect, the present invention is directed to an MIM capacitor comprising: an insulating-layer pattern on a semiconductor substrate, the insulating-layer pattern having a plurality of openings; lower electrodes which are separated from each other, each corresponding to a capacitor cell in the openings of the insulating-layer pattern, a deviation among the heights of the lower electrodes formed at sidewalls of the openings being about 300 Å; dielectric layers which are separated from each other on the lower; and a plurality of MIM capacitor cells being respectively defined by the plurality of openings and having upper electrodes separated from each other on the dielectric layers, the combined plurality of MIM capacitor cells constituting a single capacitor to which the same electrical signal is applied.

In one embodiment, the openings are arranged at a regular pitch.

In another embodiment, the insulating-layer pattern is an interwiring insulating-layer pattern.

In another embodiment, the capacitor further comprises a first upper interconnect on the insulating-layer pattern to apply the same electric signal to the upper electrodes which are separated from each other according to the capacitor cells.

In another embodiment, the capacitor further comprises a lower interconnect on the semiconductor substrate to apply the same electric signal to the lower electrodes which are separated from each other according to the capacitor cells.

In another embodiment, the capacitor further comprises a second upper interconnect formed around the areas where the capacitor cells are formed and electrically connected to the lower interconnect.

In another embodiment, the capacitor further comprises a via formed within the insulating-layer pattern and electrically connecting the lower interconnect to the second upper interconnect.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. When a layer is described as being "on" an underlying layer, the layer can be directly on the underlying layer, that is, in direct contact with the underlying layer, or intervening layers can be present. Like numbers refer to like elements throughout the specification.

A method of fabricating a MIM capacitor according to embodiments of the present invention is described with reference to FIGS. 1A through 11.

Figure 1A:
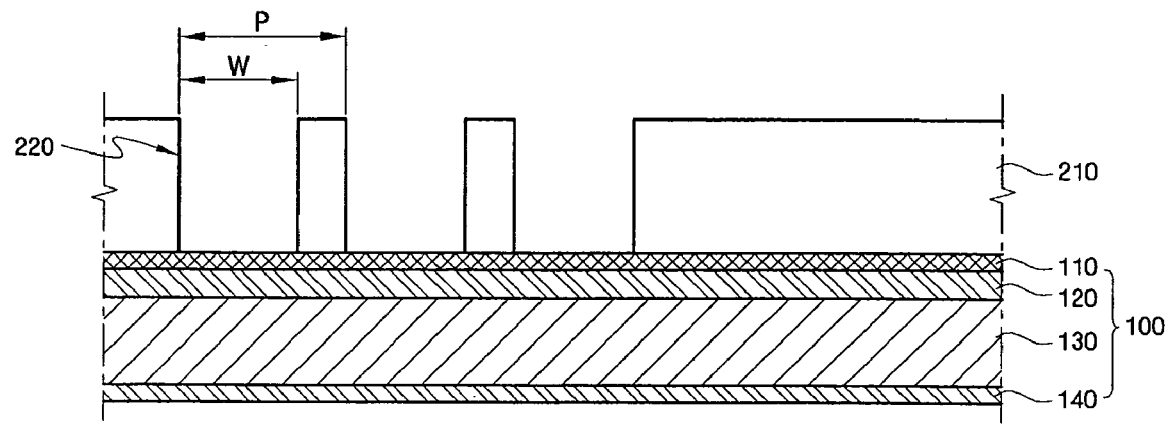
FIGS. 1A through 11 are sectional diagrams that explain a method of fabricating a MIM capacitor according to embodiments of the present invention.

Referring to FIG. 1A, first, a lower interconnect 100 is formed on top of a semiconductor substrate (not shown). The lower interconnect 100 applies the same electric signal to MIM capacitor cells which are to be formed within an insulating-layer pattern 210. A four-layer structure of TiN/Ti/Al/Ti layers 110, 120, 130, and 140 is used as the lower interconnect 100 according to an embodiment of the present invention. Here, the TiN layer 110 functions as a barrier for preventing diffusion between a lower electrode and the Al layer 130 and is formed for as an adhesion layer between the lower electrode and the Al layer 130. The Al layer 130 has an excellent electrical conductivity and is used as a base of the lower interconnect 100. The Ti layer 140 is formed for preventing diffusion between a lower substrate (not shown) and the Al layer 130.

An insulating layer (not shown) is formed on top of the lower interconnect 100 and then patterned, thereby forming the insulating-layer pattern 210 in which a plurality of openings 220 are arranged. Here, the insulating-layer pattern 210 can be formed using Plasma Enhanced-Tetra Ethyl Ortho Silicate (PE-TEOS), Fluoride Silicate Glass (FSG), Phosphor Silicate Glass (PSG), silicon oxide (SiOx), and so forth. Further, the insulating-layer pattern 210 is formed mainly using a chemical vapor deposition (CVD) method.

Since the openings 220 expose the lower interconnect 100 and are areas where the MIM capacitor cells are formed, it is preferable that the openings 220 be arranged at a regular pitch P from each other. At this time, it is preferable that a width W of the opening 220 be as wide as possible for ensuring sufficient capacitances of the MIM capacitor cells.

Figure 1B:
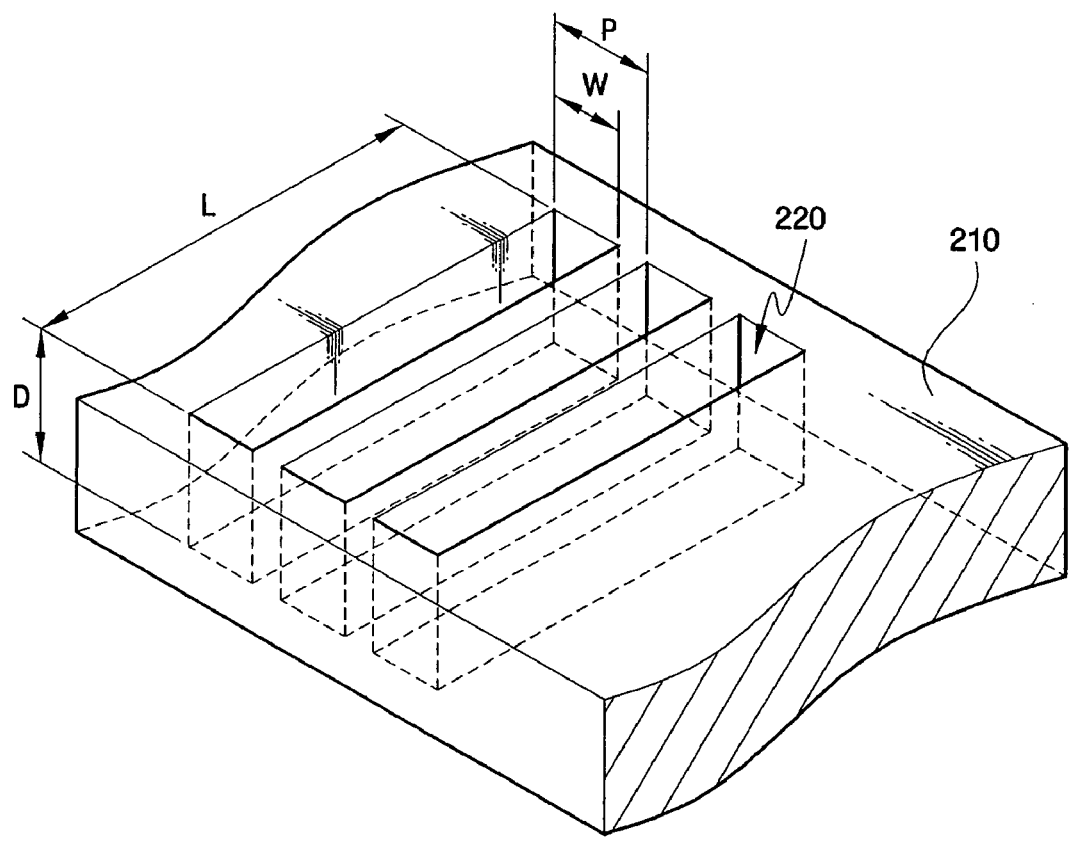

FIG. 1B is a perspective view for explaining the insulating-layer pattern 210 of the MIM capacitor according to an embodiment of the present invention.

As apparent from FIG. 1B, the plurality of openings 220 are successively formed across the MIM capacitor in a lengthwise direction of the MIM capacitor according to an embodiment of the present invention. It is preferable that the width W, a length L and a depth D of the opening 220 be as large as possible for ensuring sufficient capacitances of the MIM capacitor cells. That is, when the surface area (=2(W*D+ L*D)+(W*L)) inside the opening 220 is larger, the capacitance of the cell is larger. The width W and the depth D can be increased as much as allowed by the type of etching technology employed.

Figure 2:
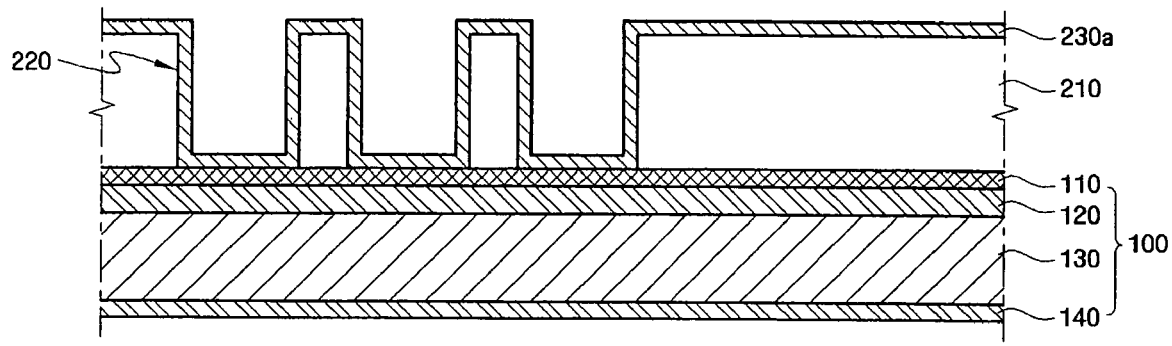

Referring to FIG. 2, a lower electrode conductive layer 230a is formed along a profile of the insulating-layer pattern 210. As the lower electrode conductive layer 230a, single layers of TiN, TiW, TaN, Pt, Ir, Ti, Ta, Ru, Rh, Os, Pd, Al, Cu, W or a stack layer thereof can be used. In an embodiment of the present invention, TiN is used. The lower electrode conductive layer 230a is formed to a thickness of about 400 Å using a physical vapor deposition (PVD) method, a CVD method, an atomic layer deposition (ALD) method, an electroplating method, or other suitable methods.

Figure 3:
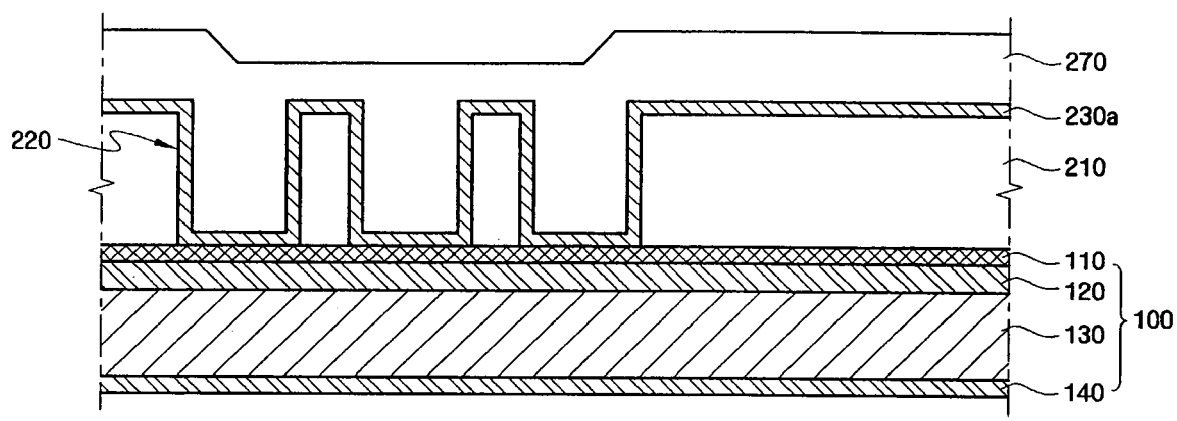

Referring to FIG. 3, a first sacrificial layer 270 for filling the openings 220 is formed on the lower electrode conductive layer 230a. The first sacrificial layer 270 is formed of a predetermined filling material having an excellent gap-filling characteristic. Accordingly, the first sacrificial layer 270 fully fills the openings 220 on the lower electrode conductive layer 230a and is hard enough to resist a force applied in a lateral direction during a chemical mechanical polishing (CMP) process. Further, when the first sacrificial layer 270 is removed, the first sacrificial layer 270 has such an etch selectivity that the lower electrode conductive layer 230a is not removed. As the first sacrificial layer 270, single layers of Flowable OXide (FOX), Tonen SilaZene (TOSZ), Undoped Silicate Glass (USG), BoroSilicate Glass (BSG), PSG, BoroPhosphoSilicate Glass (BPSG) or stacked layers thereof can be used.

The first sacrificial layer 270 is formed as follows. First, a filling material such as FOX is coated on the lower electrode conductive layer 230a using a spin coating method. A solvent within the filling material is partially removed through a soft-bake process, which is performed on top of a plate maintained at a temperature of 100-300° C. Thereafter, the remaining solvent that is not removed through the soft-bake process is removed by curing the filling material in a furnace at a temperature of 400° C. or more, thereby completing the hard first sacrificial layer 270. The first sacrificial layer 270 is formed to a thickness of 2,000-5,000 Å.

Figure 4:
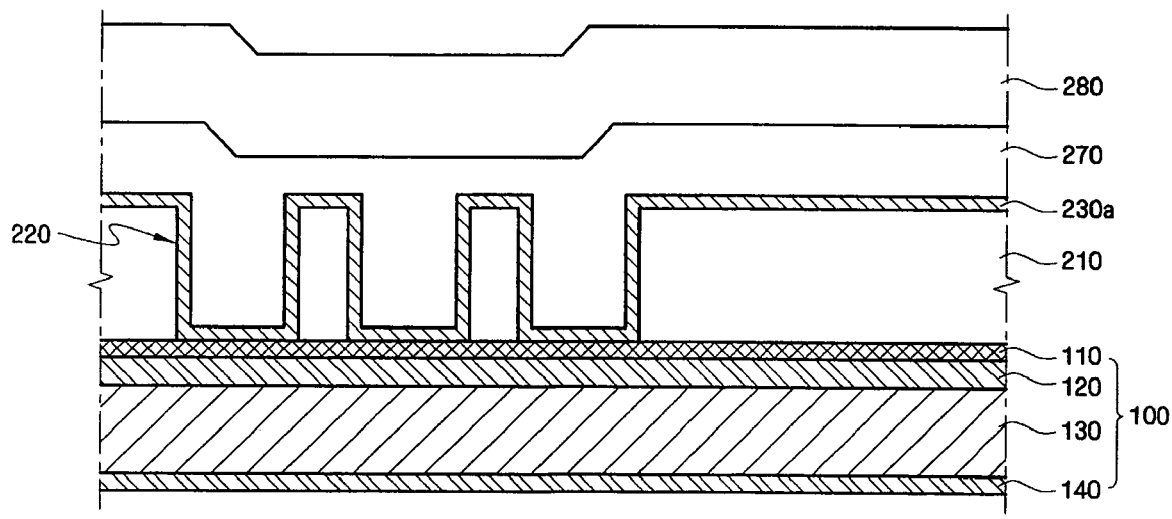

Next, referring to FIG. 4, a second sacrificial layer 280 is conventionally formed on an upper part of the first sacrificial layer 270. The second sacrificial layer 280 can be formed of the same material as the first sacrificial layer 270 or a different material. However, a PE-TEOS single layer, a Plasma Enhanced OXide (PEOX), a BPSG single layer, High Density Plasma (HDP) oxide, a PSG single layer, an USG single layer or a stacked layer thereof can be used as the second sacrificial layer 280. Further, the second sacrificial layer 280 may have a gap-filling characteristic that is different from that of the first sacrificial layer 270. It is preferable that the second sacrificial layer 280 be formed using the CVD method. The second sacrificial layer 280 is formed to a thickness of 6,000-10,000 Å, however the thickness of the second sacrificial layer 280 is not limited thereto as long as the second sacrificial layer 280 can be stably planarized in a subsequent planarizing process.

Figure 5:
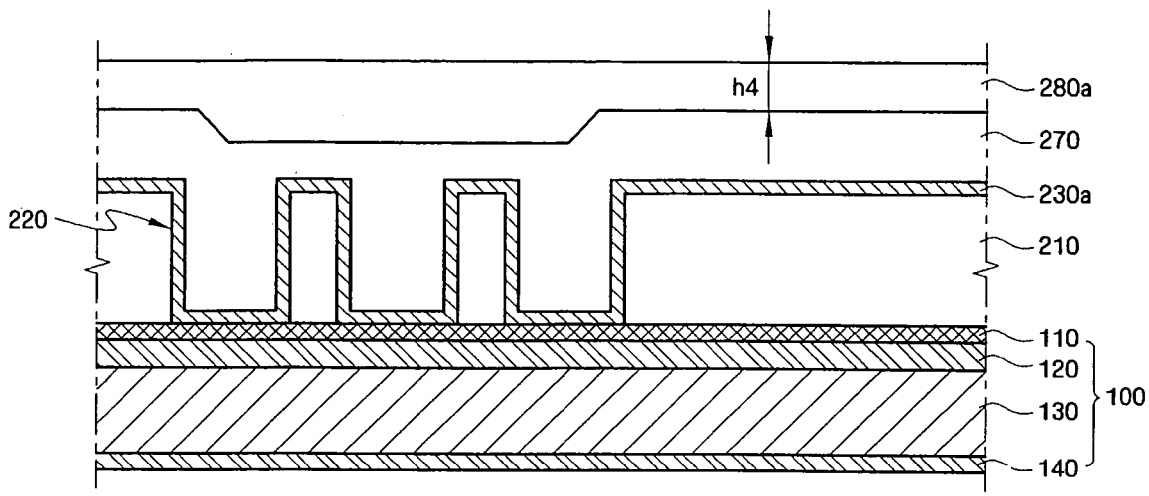

Next, referring to FIG. 5, the second sacrificial layer 280 on the upper part of the first sacrificial layer 270 is planarized through the CMP process. A planarized second sacrificial layer 280a can be formed such that a height h4 in a peripheral area of the areas where the MIM capacitor cells are to be formed is 1,000-2,000 Å. However, the value of the height h4 is not limited thereto. The height h4 can vary according to a difference between the etch selectivities of the first sacrificial layer 270 and the second sacrificial layer 280. When the difference between the etch selectivities of the first sacrificial layer 270 and the second sacrificial layer 280 is relatively small according to an embodiment of the present invention, the second sacrificial layer 280 may not be planarized to expose a surface of the first sacrificial layer 270 and the second sacrificial layer 280 may not be planarized together with a portion of the first sacrificial layer 270. Slurry used in the planarizing process can include slurry consisting of HPS, ceria, silica, $Mn_2O_3$ or a combination thereof, and the invention is not limited thereto.

Figure 6:
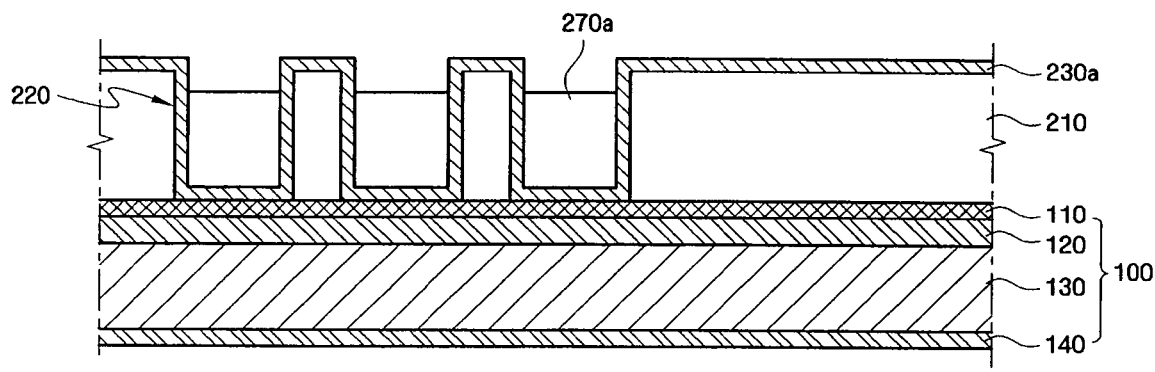

Next, referring to FIG. 6, an upper surface of the lower electrode conductive layer 230a is exposed. The upper surface of the lower electrode conductive layer 230a is exposed through an etch-back process such as a wet etch-back process and a dry etch-back process according to an embodiment of the present invention. However, other etch-back process can be used without limitation.

It is preferable that the etch selectivity of the second sacrificial layer 280a to the first sacrificial layer 270 (see FIG. 5) in the etch-back process be 1.2:1 through 1.5:1. Further, since the thickness of a first sacrificial layer 270a remaining within the opening 220 in a resultant structure obtained after completing the etch-back process corresponds to the height of a lower electrode (230 of FIG. 8), which is to be formed at a sidewall of the opening 220, a surface of the first sacrificial layer 270a can be substantially level with a surface of the insulating-layer pattern 210 or can be recessed to a lower part of the insulating-layer pattern 210 to a certain depth. Accordingly, the etch selectivity of the first sacrificial layer 270 to the lower electrode conductive layer 230a in the etch-back process of the first sacrificial layer 270 is 10:1 or higher, for example, 10:1 through 50:1. To obtain the above etch selectivity, an HF solution is used in the wet etch-back process and plasma including at least one gas such as $C_5F_8$, $O_2$, Ar, or $N_2$ is used in the dry etch-back process.

Figure 7:
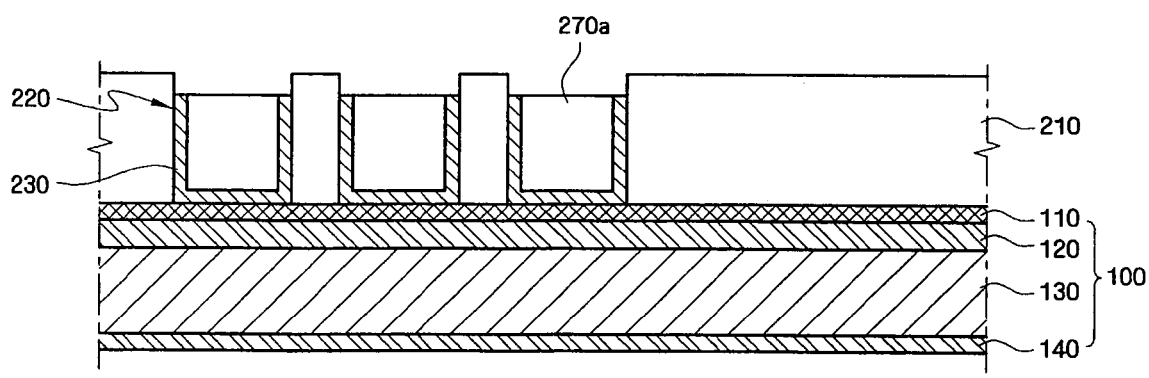

Referring to FIG. 7, the exposed lower electrode conductive layer 230a (see FIG. 6) is removed, thereby forming a plurality of lower electrodes 230 which are separated from each other according to the MIM capacitor cells. The exposed lower electrode conductive layer 230a is removed through the etch-back process according to an embodiment of the present invention. However, the exposed lower electrode conductive layer 230a can be removed using other process.

In a case of using the etch-back process, the lower electrode conductive layer 230a is removed using plasma including at least one gas selected from $CF_4$, $O_2$, Ar, and $N_2$, which can be commonly used in selectively chemical etching. For example, in a case of using Ru as in the case of the lower electrode conductive layer 230a, the etch-back process is performed using plasma including $O_2$. Plasma including chlorine-series gas can be used according to a material of the lower electrode conductive layer 230a. Here, it is preferable that a pressure of the plasma be as high as 10-100 mTorr to maximize an effect of the chemical etching. Further, it is preferable that the distribution of the plasma be adjusted in order to selectively remove only the exposed lower electrode conductive layer 230a. When the distribution of the plasma is adjusted, ions of the plasma do not reach the sidewalls of the openings 220 and the remaining first sacrificial layer 270a covers areas where the lower electrodes 230 separated according to the MIM capacitor cells are to be formed, thereby making it possible to prevent the lower electrode conductive layer 230a formed at the sidewalls of the openings 220 from being removed by the etch-back process. A temperature range of plasma is about 10-250° C.

In particular, since a deviation of the remaining first sacrificial layer 270a is less than about 300 Å according to an embodiment of the present invention, an exposed portion of the exposed lower electrode conductive layer 230a is substantially regular. Accordingly, when the lower electrodes 230 separated from each other according to the MIM capacitor cells are formed through the etch-back process, the deviation of the lower electrodes 230 formed at the sidewalls of the openings 220 is less than about 300 Å. Accordingly, the capacitances of the resulting MIM capacitor cells are substantially the same.

Figure 8:
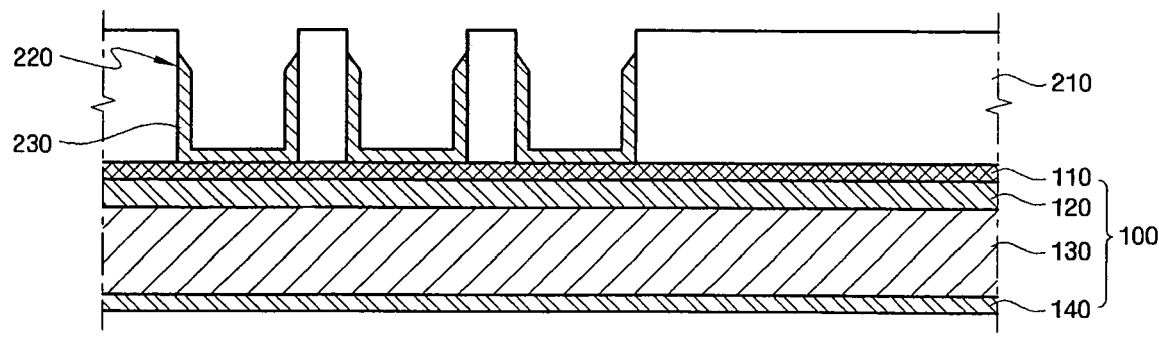

Referring to FIG. 8, the remaining first sacrificial layer 270a is removed. A wet etching method is used in an embodiment of the present invention, but is not used to limit the scope of the present invention.

Figure 9:
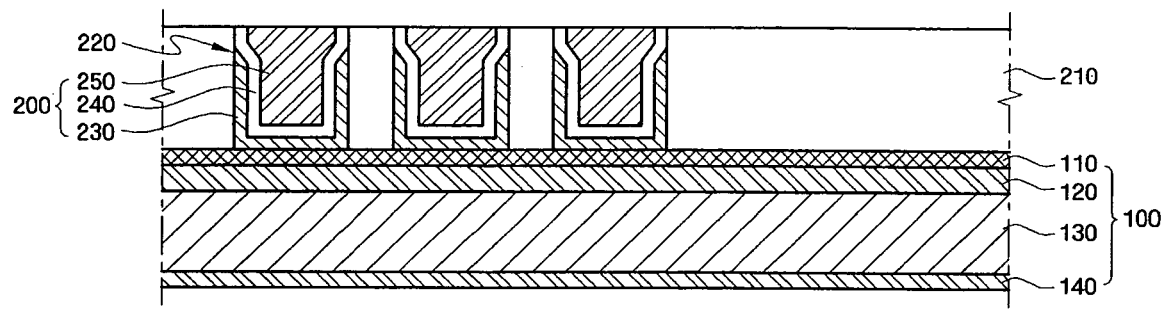

Referring to FIG. 9, a dielectric layer is formed on the lower electrode 230 along a profile of the lower electrode 230 and an upper electrode conductive layer is formed on the dielectric layer to fill the openings 220. Thereafter, the dielectric layer and the upper electrode conductive layer are planarized using the CMP process to expose the insulating-layer pattern 210, thereby forming dielectric layers 240 and upper electrodes 250 which are separated from each other among the MIM capacitor cells. Accordingly, a plurality of MIM capacitor cells 200 separated from each other and each comprising the lower electrodes 230, the dielectric layers 240, and the upper electrodes 250 are completed.

Preferably, the thickness of the dielectric layers 240 is as small as possible and the surface area thereof is as wide as possible. Further, it is preferable that a material having a high dielectric constant such as SiN, $Al_2O_3$, $Ta_2O_5$, TiO, $HfO_2$, $La_2O_5$, $ZrO_2$, TaON, $SrTiO_3$, $(Ba, Sr)TiO_3$, Pb $(Zr, Ti)O_3$, or (Pb, La) $(Zr, Ti)O_3$ be used for the dielectric layer 240. The thickness of the dielectric layer 240 can vary according to the type of material used for forming the dielectric layer 240. For example, in a case of using SiN, the dielectric layer 240 is formed to a thickness of about 700 Å.

For the upper electrode 250, single layers of TiN, TiW, TaN, Pt, Ir, Ti, Ta, Ru, Rh, Os, Pd, Al, Cu, W, or a stack layer thereof can be used. A TiN/W layer is used as the upper electrode 250 according to a preferred embodiment of the present invention, and the invention is not limited thereto. Further, the W layer is formed on the Ti layer. As the upper electrode 250, another conductive material can be used in consideration of characteristics and coefficients of thermal expansion of materials of layers that are to be formed on upper and lower parts of the upper electrode 250.

Figure 10:
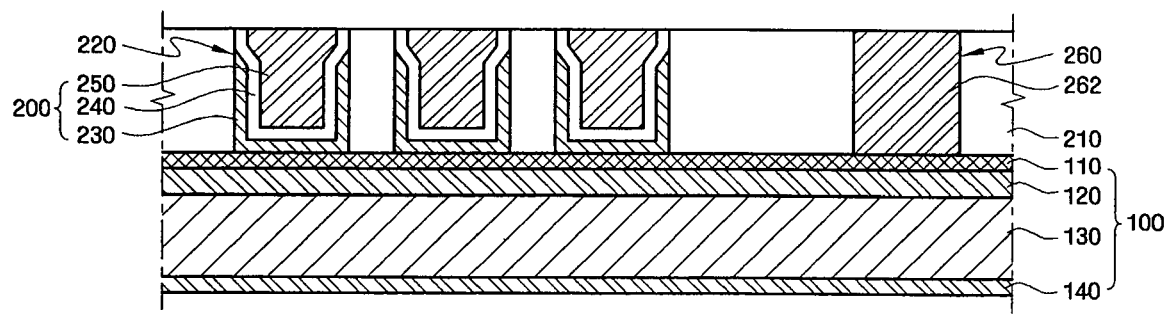

Referring to FIG. 10, a via 260 is formed around the areas where the MIM capacitor cells 200 are formed. Thereafter, a via conductive layer 262 and a via barrier layer (not shown) are formed in the via 260. Here, the via conductive layer 262 electrically connects an upper interconnect (not shown) and the lower interconnect 100 which are to be formed on the insulating-layer pattern 210, thereby allowing a predetermined operation voltage to be applied to the lower interconnect 100. A metal such as W is primarily used as the via conductive layer 262. Further, the via barrier layer prevents a material between the via conductive layer 262 and the insulating-layer pattern 210 from diffusing and improves an adhesion between the via conductive layer 262 and the insulating-layer pattern 210. The via barrier layer can be formed using a single layer of TiN, or a double layer of Ti/TiN.

Figure 11:
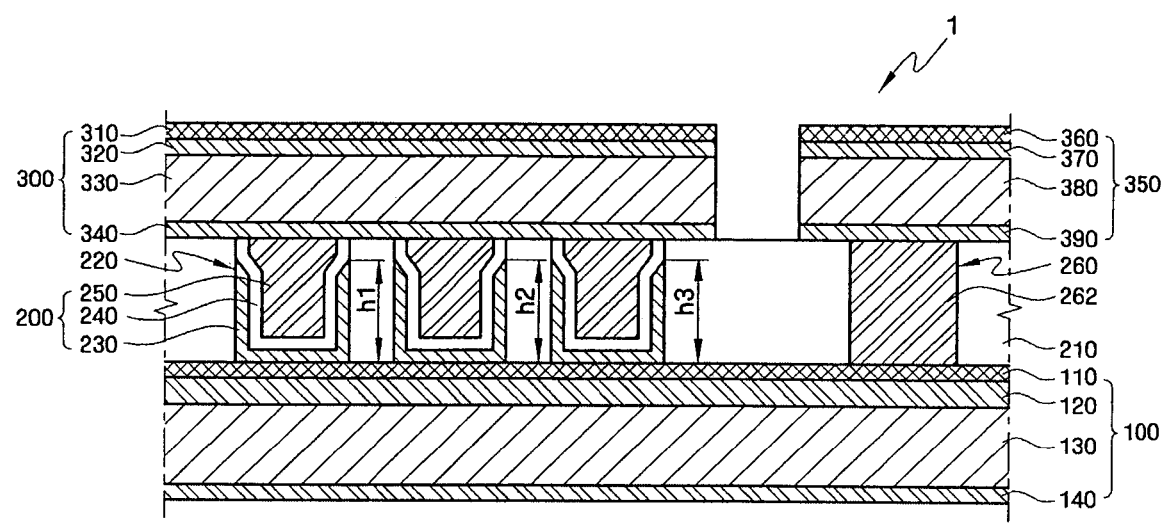

Referring to FIG. 11, TiN/Ti/Al/Ti layers 310, 320, 330 and 340 are sequentially formed on the insulating-layer pattern 210, in which the MIM capacitor cells 200, the via 260, the via conductive layer 262, and so forth, are formed, and then patterned, thereby forming a first upper interconnect 300 and a second upper interconnect 350. The first upper interconnect 300 applies the same electrical signal to the plurality of upper electrodes 250, which are separated from each other among the MIM capacitor cells. Further, the second upper interconnect 350 applies the same electric signal to the lower electrodes 230 through the via 260 and the lower interconnect 100. Thus, an MIM capacitor 1 comprising the plurality of MIM capacitor cells 200 is completed. Here, the TiN layer 310 functions as an anti-reflection layer. The Ti layer 320 facilitates an adhesion between the layers formed on upper and lower parts of the Ti layer 320 and prevents diffusion thereof. The Al layer 330 has an excellent electrical conductivity and functions as a base of an upper interconnect layer. Also, the Ti layer 340 facilitates adhesion between upper and lower layers of the Ti layer 340 and prevents diffusion thereof.

As shown in FIG. 11, the MIM capacitor 1 according to an embodiment of the present invention includes the lower interconnect 100, the MIM capacitor cells 200, the first and second upper interconnects 300 and 350, and so forth.

The lower interconnect 100 applies the same electrical signal to the plurality of lower electrodes 230, which are separated from each other according to the MIM capacitor cells 200 on the semiconductor substrate (not shown). Further, although the MIM capacitor 1 according to the above-described embodiment of the present invention has a four-layer structure such as TiN/Ti/Al/Ti, the invention is not limited thereto.

The MIM capacitor cells 200 are formed on the insulating-layer pattern 210, in which the plurality of openings 220 are formed at a regular pitch from each other, and constitute the MIM capacitor 1. The insulating-layer pattern 210 can be an interwiring insulating-layer pattern. Each of the MIM capacitor cells 200 includes the lower electrode 230, the dielectric layer 240, and the upper electrode 250, and is separated from a neighboring MIM capacitor cell 200.

A deviation among heights h1, h2, and h3 of the plurality of lower electrodes 230 is less than about 300 Å, and preferably about 100 Å, in comparison with a deviation of about 2,000 Å, or more, in a conventional MIM capacitor.

The dielectric layers 240 are formed on the lower electrodes 230 along profiles of the lower electrodes 230 and separated from each other. It is preferable that the thickness of the dielectric layer 240 be relatively thin and that the surface area thereof be as wide as possible.

The upper electrodes 250 are formed on the dielectric layers 240 and separated from each other. The upper electrode 250 can be fabricated using the same fabrication method as the lower electrode 230.

The first upper interconnect 300 is formed on the upper electrodes 250 so as to apply the same electric signal to the plurality of upper electrodes 250 which are separated from each other according to the MIM capacitor cells 200 on the insulating-layer pattern 210.

The second upper interconnect 350 is formed around the areas where the MIM capacitor cells 200 are formed so that the second upper interconnect 350 is electrically connected to the lower interconnect 100 through the via 260.

The via 260 electrically connects the lower interconnect 100 to the second upper interconnect 350.

The present invention is now described using an experimental example. However, the experimental example is for illustrative purposes and other examples and applications can be readily envisioned by a person of ordinary skill in the art. Since a person skilled in the art can sufficiently analogize the technical contents which are not described in the following experimental examples, the description thereof is omitted.

After the second sacrificial layer on the upper part of the first sacrificial layer was patterned through the CMP process as shown in FIG. 5, the upper surface of the lower electrode conductive layer was exposed using the etch-back process as shown in FIG. 6. The surface of the first sacrificial layer after performing the etch-back process was recessed in the lower part of the insulating-layer pattern to a certain depth. Thereafter, a sectional photograph was taken by using a vertical scanning electron microscope (VSEM) and a deviation between the first sacrificial layer 270a in the central MIM capacitor cell 200 and the first sacrificial layer 270a in the marginal MIM capacitor cell 200 was found to be less than 100 Å. Accordingly, the risk of a dishing phenomenon, i.e. a phenomenon that a metal material in a trench is polished like a dish, can be reduced and uniformity in the capacitance between the MIM capacitor cells can be increased.

The metal-insulator-metal (MIM) capacitor and the method of fabricating the same according to the present invention provide at least the following advantages.

First, high performance capacity can be formed by forming a three-dimensional capacitor structure. Second, since a deviation among the heights of lower electrodes is reduced, uniformity in the capacitance of capacitor cells is improved. Third, the operation characteristics and the reliability of a semiconductor device having the MIM capacitor are improved.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of fabricating a metal-insulator-metal (MIM) capacitor, comprising:

forming an insulating-layer pattern on a semiconductor substrate, the insulating-layer pattern having a plurality of openings that respectively define areas where capacitor cells are to be formed;

forming a lower electrode conductive layer on sidewalls of the openings, an upper surface of the insulating-layer and the semiconductor substrate exposed by the openings, the lower electrode conductive layer comprising metal material;

forming a first sacrificial layer on the lower electrode conductive layer to fill the openings and cover the upper surface of the insulating-layer;

forming a second sacrificial layer on the first sacrificial layer, excluding filling the openings;

planarizing the second sacrificial layer using a chemical mechanical polishing (CMP) process such that the second sacrificial layer remains on the first sacrificial layer;

after planarizing the second sacrificial layer, exposing an upper surface of the lower electrode conductive layer using an etch-back process such that remaining portions of the first sacrificial layer remain in the openings;

removing the exposed lower electrode conductive layer to form a plurality of lower electrodes that are separated from each other, each corresponding to a capacitor cell;

removing the remaining portions of the first sacrificial layer in the openings; and forming dielectric layers and upper electrodes, that are separated from each other, each corresponding to a capacitor cell, on each of the lower electrodes to provide a plurality of MIM capacitor cells constituting a single capacitor to which the same electrical signal is applied.

2. The method of claim 1, wherein the first sacrificial layer is formed of a material having a better gap-filling characteristic than the second sacrificial layer.

3. The method of claim 1, wherein the second sacrificial layer is formed using a chemical vapor deposition (CVD) method.

4. The method of claim 1, wherein the second sacrificial layer is formed of one of a Plasma Enhanced-Tetra Ethyl Ortho Silicate (PE-TEOS) single layer, a Plasma Enhanced OXide (PEOX) single layer, a BoroPhosphoSilicate Glass (BPSG) single layer, High Density Plasma (HDP) oxide, an Undoped Silicate Glass (USG) single layer, and a stacked layer thereof.

5. The method of claim 4, wherein the first sacrificial layer is formed of one of a Flowable OXide (FOX) single layer, Tonen SilaZene (TOSZ) single layer, USG single layer, Boro-Silicate Glass (BSG), Phosphor Silicate Glass (PSG), BPSG, and a stacked layer thereof.

6. The method of claim 1, wherein the first sacrificial layer is formed of one of a Flowable OXide (FOX) single layer, Tonen SilaZene (TOSZ) single layer, USG single layer, Boro-Silicate Glass (BSG), Phosphor Silicate Glass (PSG), BPSG, and a stacked layer thereof.

7. The method of claim 1, wherein the second sacrificial layer is formed to a thickness of 6,000-10,000 Å.

8. The method of claim 1, wherein the first sacrificial layer is formed to a thickness of 2,000-5,000 Å.

9. The method of claim 1, wherein planarizing the second sacrificial layer is performed so that a thickness of the second sacrificial layer in a peripheral area of the areas where the MIM capacitor cells are to be formed is in the range of 1,000-2,000 Å.

10. The method of claim 1, wherein the etch selectivity of the second sacrificial layer to the first sacrificial layer is controlled to be 1.2:1 through 1.5:1 in the etch-back process.

11. The method of claim 10, wherein exposing the upper surface of the lower electrode conductive layer is performed so that a surface of the first sacrificial layer remaining within the openings is substantially level with a surface of the insulating-layer pattern or is recessed in the insulating-layer pattern to a certain depth.

12. The method of claim 1, wherein exposing the upper surface of the lower electrode conductive layer is performed so that a surface of the first sacrificial layer remaining within the openings is substantially level with a surface of the insulating-layer pattern or is recessed in the insulating-layer pattern to a certain depth.

13. The method of claim 1, wherein a deviation of the height of the first sacrificial layer that fills each of the openings in a resultant structure obtained by exposing the upper surface of the lower electrode conductive layer is about 300 Å.

14. The method of claim 1, wherein the openings are arranged at a regular pitch.

15. The method of claim 1, wherein the insulating-layer pattern is an interwiring insulating-layer pattern.

16. The method of claim 1, further comprising forming a first upper interconnect on the insulating-layer pattern to apply the same electric signal to the upper electrodes which are separated from each other according to the MIM capacitor cells.

17. The method of claim 1, further comprising, before forming the insulating-layer pattern, forming a lower interconnect on the semiconductor substrate to apply the same electric signal to the lower electrodes which are separated from each other according to the MIM capacitor cells.

18. The method of claim 17, further comprising forming a second upper interconnect around the areas where the capacitor cells are formed, wherein the second upper interconnect is electrically connected to the lower interconnect.

19. The method of claim 18, further comprising, before forming the second upper interconnect, forming a via within the insulating-layer pattern, the via electrically connecting the lower interconnect to the second upper interconnect.

* * * * *